United States Patent
Hellberg et al.

(10) Patent No.: US 10,187,014 B2
(45) Date of Patent: Jan. 22, 2019

(54) DRIVER CIRCUIT FOR COMPOSITE POWER AMPLIFIER

(71) Applicant: TELEFONAKTIEBOLAGET LM ERICSSON (PUBL), Stockholm (SE)

(72) Inventors: Richard Hellberg, Huddinge (SE); Tomasz Kaczkowski, Upplands Väsby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 4 days.

(21) Appl. No.: 15/516,748

(22) PCT Filed: Oct. 7, 2014

(86) PCT No.: PCT/SE2014/051164
§ 371 (c)(1),
(2) Date: Apr. 4, 2017

(87) PCT Pub. No.: WO2016/056956
PCT Pub. Date: Apr. 14, 2016

(65) Prior Publication Data
US 2017/0244366 A1    Aug. 24, 2017

(51) Int. Cl.
*H03F 3/68* (2006.01)
*H03F 1/02* (2006.01)
(Continued)

(52) U.S. Cl.
CPC ............. *H03F 1/0288* (2013.01); *H03F 1/02* (2013.01); *H03F 1/0294* (2013.01);
(Continued)

(58) Field of Classification Search
CPC ........ H03F 3/602; H03F 1/0288; H03F 3/211; H03F 3/19; H03F 1/02; H03F 3/24; H03F 1/3241; H03F 1/0294
(Continued)

(56) References Cited

U.S. PATENT DOCUMENTS 2,269,518 A    1/1942   Chireix et al.
6,825,719 B1   11/2004  Barak et al.
(Continued)

FOREIGN PATENT DOCUMENTS

EP    1583228 A2     10/2005
WO    2004057755 A1  7/2004

OTHER PUBLICATIONS

Aref et al., "Efficient amplification of signals with high PAPR using a novel multilevel LINC transmitter architecture," Proceedings of the 7th European Microwave Integrated Circuits Conference, Oct. 29-30, 2012, Amsterdam, NL.
(Continued)

*Primary Examiner* — Khanh V Nguyen
*Assistant Examiner* — Khiem Nguyen
(74) *Attorney, Agent, or Firm* — Patent Portfolio Builders PLLC

(57) ABSTRACT

A driver circuit for a composite power amplifier configured to operate in at least one Chireix-mode a first and a second sub-amplifier for amplification of an input signal into an output signal is disclosed. An input network of the driver circuit comprises a means configured to provide a first signal which is linearly derivable from the input signal, and a second signal which is non-linearly derivable from the input signal. The input network combines the first signal, at zero degrees phase shift, and the second signal, at 90 degrees phase shift, to obtain a first feeding signal for the first sub-amplifier. Furthermore, the input network combines the first signal, at 180 degrees phase shift, and the second signal, at 90 degrees phase shift, to obtain a second feeding signal for the second sub-amplifier.

13 Claims, 18 Drawing Sheets

(51) Int. Cl.
*H03F 1/32* (2006.01)
*H03F 3/24* (2006.01)
*H03F 3/60* (2006.01)
*H03F 3/19* (2006.01)
*H03F 3/21* (2006.01)

(52) U.S. Cl.
CPC ............ *H03F 1/3241* (2013.01); *H03F 3/19* (2013.01); *H03F 3/211* (2013.01); *H03F 3/24* (2013.01); *H03F 3/602* (2013.01); *H03F 2200/198* (2013.01); *H03F 2200/255* (2013.01); *H03F 2200/451* (2013.01); *H03F 2203/21145* (2013.01)

(58) Field of Classification Search
USPC .............................................. 330/124 R, 295
See application file for complete search history.

(56) References Cited

U.S. PATENT DOCUMENTS

| | | | |
|---|---|---|---|
| 7,145,387 B2* | 12/2006 | Hellberg | ............... H03F 1/0205 330/124 R |
| 7,279,971 B2 | 10/2007 | Hellberg et al. | |
| 2003/0137346 A1 | 7/2003 | Hellberg | |

OTHER PUBLICATIONS

International Search Report and Written Opinion dated Jun. 9, 2015 in related International Application No. PCT/SE2014/051164.

* cited by examiner

DRIVER CIRCUIT FOR COMPOSITE POWER AMPLIFIER

TECHNICAL FIELD

Embodiments herein relate to power amplifiers for wireless communication systems, such as telecommunication systems. In particular, a driver circuit for a power amplifier for amplification of an input signal into an output signal is disclosed. Furthermore, a composite power amplifier, a radio network node and a user equipment, comprising the power amplifier, are disclosed.

BACKGROUND

Power amplifiers are widely used in communication systems, for example in radio base stations and cellular phones of a cellular radio network. In such cellular radio network, power amplifiers typically amplify signals of high frequencies for providing a radio transmission signal. A consideration in the design of power amplifiers is the efficiency thereof. High efficiency is generally desirable so as to reduce the amount of power that is dissipated as heat. Moreover, in many applications, such as in a satellite or a cellular phone, the amount of power that is available may be limited due to powering by a battery, included in e.g. the satellite. An increase in efficiency of the power amplifier would allow an increase of operational time between charging of the battery.

Outphasing type of power amplifier consists of two conventional amplifiers interacting with each other in order to keep Radio Frequency (RF) voltage as close maximum as possible and RF currents as low as possible. In more detail, it is the RF voltage and current at intrinsic transistor that is kept at maximum and minimum, respectively, in average over a signal amplitude distribution. In this manner, an efficiency of the power amplifier is as high as possible. The maximum voltage at the intrinsic transistor is obtained by taking the voltage over load as vector sum of the voltages of the constituent amplifiers. The load voltage is adjusted by adjusting the relative phase of the signals from two amplifiers.

In a traditional outphasing power amplifier, RF voltages are kept at maximum all the time, e.g. over time varying envelope of amplified signal.

In a Chireix type of power amplifier, compensation reactance is introduced to reduce the reactive parts of the currents, i.e. in average over signal amplitude distribution.

Even more efficient solution for outphasing is a power amplifier disclosed in U.S. Pat. No. 2,269,518A. This power amplifier was developed by Chireix and Fagot in the 1940s. With the power amplifier thus disclosed two amplifiers are driven in a linear fashion, with constant phases, for low amplitudes below a breakpoint. Outphasing occurs for amplitudes higher than the breakpoint. Accordingly, the breakpoint is set where the outphasing begins. The breakpoint may be set during design of the power amplifier.

WO2004/057755 discloses a combination of a peak amplifier of a Doherty amplifier and a pair of amplifiers forming a Chireix pair. This type of power amplifier has three optima in efficiency curve, and thus much higher average efficiency. Sometimes this kind of amplifier is referred to as a Chireix-Doherty power amplifier.

In U.S. Pat. No. 7,279,971B2 combination of multiple Chireix pairs is used. In order to reach the maximum efficiency up to four RF drive signals need to be used, e.g. two drive signals for each Chireix pair. Amplitude and phase as a function of output power are controlled.

In U.S. Pat. No. 6,825,719B1, generation of the 2 outphasing drive signals, and the drive signals power control, e.g. for low power levels, is achieved with external control and phase shifters. The generation of the signals is complex and expensive due to required hardware and power consumption.

A problem with the above mentioned power amplifiers and drives therefor may be that they suffer from high complexity and cost. Moreover, another problem may be that the power amplifiers need external control and/or feedback.

SUMMARY

An object is to provide a driver circuit for a composite power amplifier of the above mentioned kind which overcomes, or at least mitigates, at least one of the above mentioned problems.

According to an aspect, the object is achieved by a driver circuit for a composite power amplifier configured to operate a first and a second sub-amplifier for amplification of an input signal into an output signal. The first and second sub-amplifiers are connected to an input network for receiving the input signal at an input port of the input network. The composite power amplifier is configured to operate the first and second sub-amplifiers in at least one Chireix-mode. The driver circuit for the composite power amplifier is characterized in that the input network comprises a means configured to provide a first signal derived from the input signal, wherein an amplitude of the first signal is linearly derivable from an amplitude of the input signal over an operational amplitude range of the composite power amplifier. The means is further configured to provide a second signal derived from the input signal, wherein an average rate of amplitude change of the second signal versus amplitude change of the input signal in a first amplitude range is less than an average rate of amplitude change of the second signal versus amplitude change of the input signal in a second amplitude range. The input network further comprises a first combiner configured to combine the first signal, at zero degrees phase shift, and the second signal, at 90 degrees phase shift, to obtain a first feeding signal to be fed to the first sub-amplifier, and a second combiner configured to combine the first signal, at 180 degrees phase shift, and the second signal, at 90 degrees phase shift, to obtain a second feeding signal to be fed to the second sub-amplifier.

According to another aspect, the object is achieved by a composite power amplifier, comprising the driver circuit therefor.

According to a yet other aspect, the object is achieved by a radio network node, comprising the driver circuit for the composite power amplifier.

According to a further aspect, the object is achieved by a user equipment, comprising the driver circuit for the composite power amplifier.

According to the embodiments herein, drive signals, e.g. the first and second feeding signal, to Chireix-Fagot type amplifiers, and higher order amplifiers that contain Chireix as a part, are provided. The drive signals are made by splitting a input signal in two parts, e.g. the first signal and the second signal. The second signal has been processed by e.g. a class C power amplifier. The second signal is thus non-linearly derivable from the input signal over the operational range, whereas the first signal is linearly derivable from the input signal over the operational range. In more detail, the second signal may be said to be linearly derivable in the first amplitude range and the second amplitude range, where the amplitude change in the second amplitude range is greater than the amplitude change in the first amplitude range. The first and second signals are added together with two different, fixed, phase relationships. In this manner, the first and second feeding signals are obtained. The phase relationships change with amplitude as required to the functioning of Chireix outphasing amplifiers, i.e. as the composite power amplifier being configured to operate the first and second sub-amplifiers in at least one Chireix-mode. Thanks to the embodiments herein the phase relationships are obtained without complicated voltage-to-phase conversion and/or control circuitry as in e.g U.S. Pat. No. 6,825,719B1. Accordingly, the embodiments herein provide the first and second feeding signals at correct amplitudes without any extra circuitry. The correct amplitudes are thus the amplitudes of the first and second signals, obtained thanks to signal response of the driver circuit described herein.

The embodiments herein are fully analog, incorporated in the input network of the composite power amplifier. There is no need for complicated feedback or control from the output of the composite power amplifier.

As compared to U.S. Pat. No. 6,825,719B1, mentioned above, the embodiments herein provide an alternative solution that provides the same functionality, but uses only few additional components compared to a conventional drive stage.

Multi-stage power amplifiers, with three or more stages, in the form of Chireix-Doherty, Chireix-Chireix power amplifiers etc., may also be provided using the embodiments described herein.

The embodiments enable use of highly efficient multi order power amplifiers without increasing complexity for providing multiple drive signals.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

In order to better appreciate the embodiments herein, an existing Chireix amplifier is analyzed here.

Figure 1:
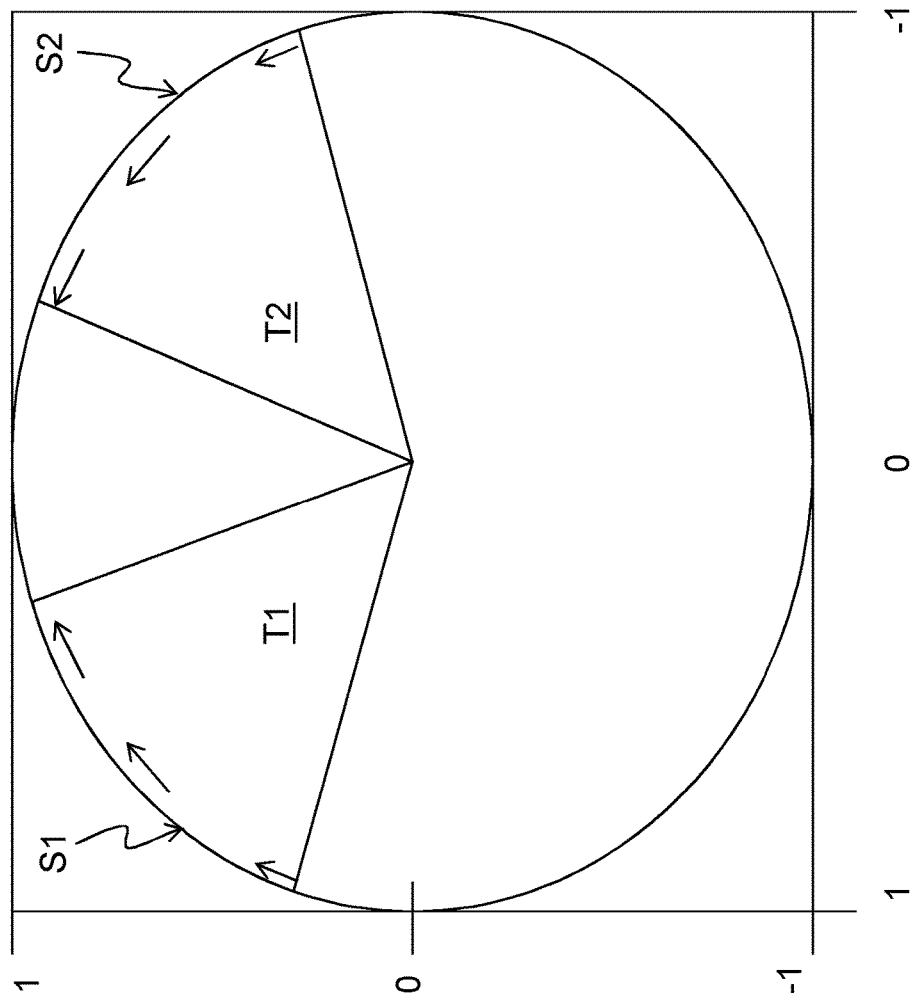
FIG. 1 is a diagram illustrating voltages at different output amplitudes in an existing Chireix amplifier.

FIG. 1 shows a typical view of voltages at different output amplitudes in the existing Chireix amplifier. The existing Chireix amplifier includes two sub-amplifiers, each of which is feed with a respective drive signal S1, S2. As can be seen, the voltages of the respective drive signals are constantly full-scale over an amplitude range. That is to say the voltages are at the perimeter of the circle and increase of input amplitude is indicated by the arrows. Phase variation of the drive signals are indicated by an angle of the sectors T1, T2.

Output currents of the sub-amplifiers are analysed while being decomposed into a linear part and a nonlinear part.

Figure 2:
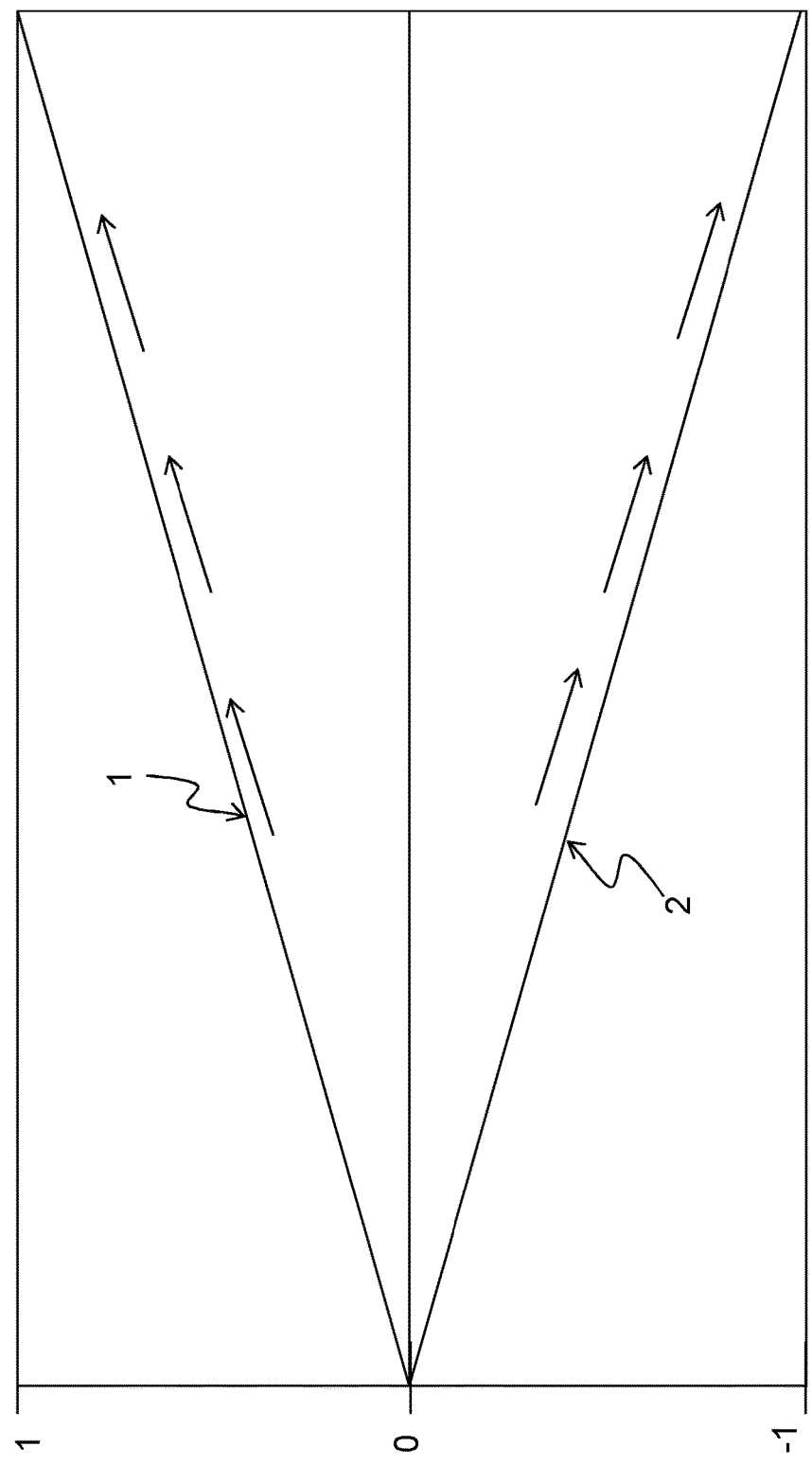
FIG. 2 is another diagram illustrating a linear part of decomposed output RF currents for each sub-amplifier.

In FIG. 2, the linear part of the decomposed output RF currents are shown for each sub-amplifier. A current envelope 1 for one of the sub-amplifiers is illustrated as a response to an amplitude ramped up input signal. Similarly, a further current envelope 2 for the other sub-amplifiers is illustrated. It may be observed that see that there is a linear component in both RF currents, and that they are in anti-phase at the different sub-amplifiers. Arrows in FIG. 2 indicates effect of increased of input amplitude.

Figure 3:
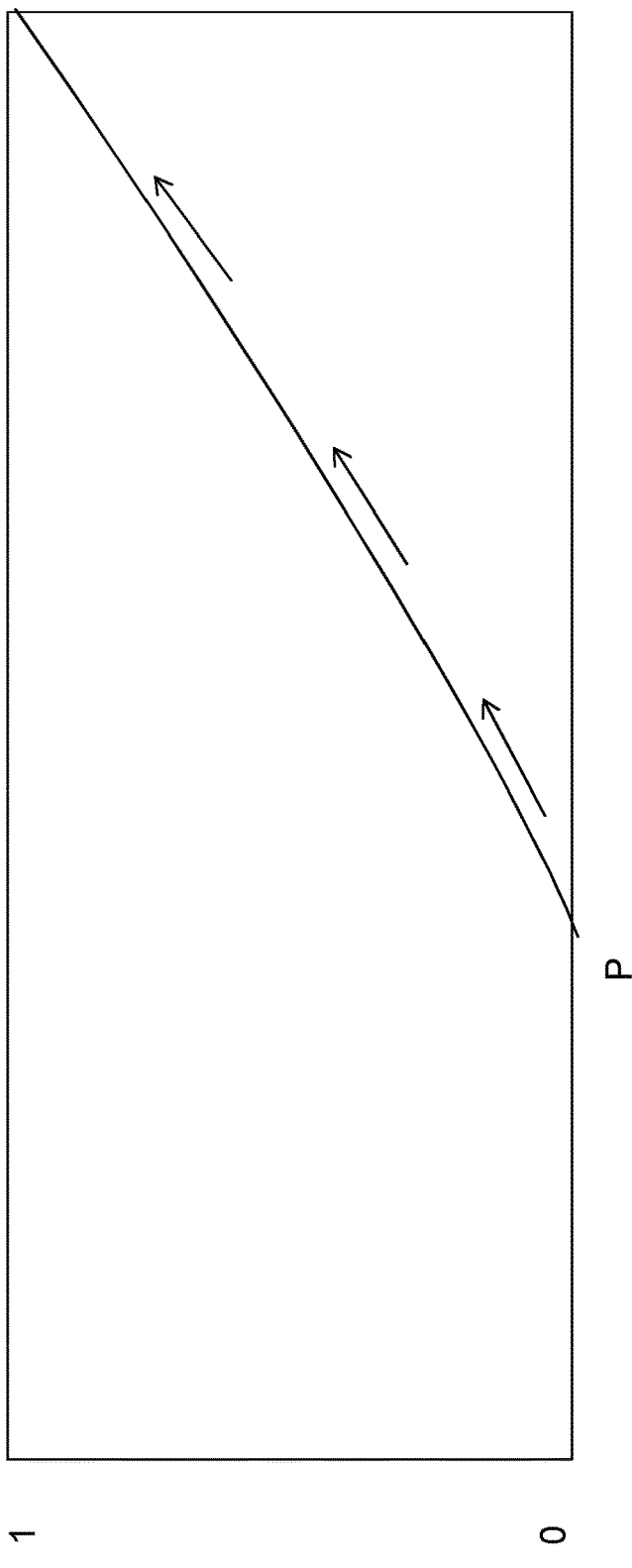
FIG. 3 is a further diagram illustrating a nonlinear part of decomposed output RF currents for each sub-amplifier.

In FIG. 3, the nonlinear part of the decomposed output RF currents are shown for each sub-amplifier. The nonlinear part is at an angle 90 degrees from the linear part. The nonlinear decomposed output RF currents are in the same phase for both sub-amplifiers, on-top of each other in the Figure and thus not visible. The amplitude is zero, or almost zero, below a transition point P. Then, the amplitude increases sub-linearly, compare with line L, towards a maximum amplitude. This component can be approximated by a class C amplifier, or even better accuracy is required, by two or more class-C amplifiers, with different bias, connected in parallel. Again, arrows in FIG. 3 indicate effect of increased of input amplitude.

While the above current analysis have been realized, the present inventors have designed an analogue input network for driving of composite power amplifiers, which are operable in at least one Chireix-mode.

Throughout the following description similar reference numerals have been used to denote similar features, such as elements, units, modules, circuits, nodes, parts, items or the like, when applicable. In the Figures, features that appear in some embodiments are indicated by dashed lines.

Figure 4:
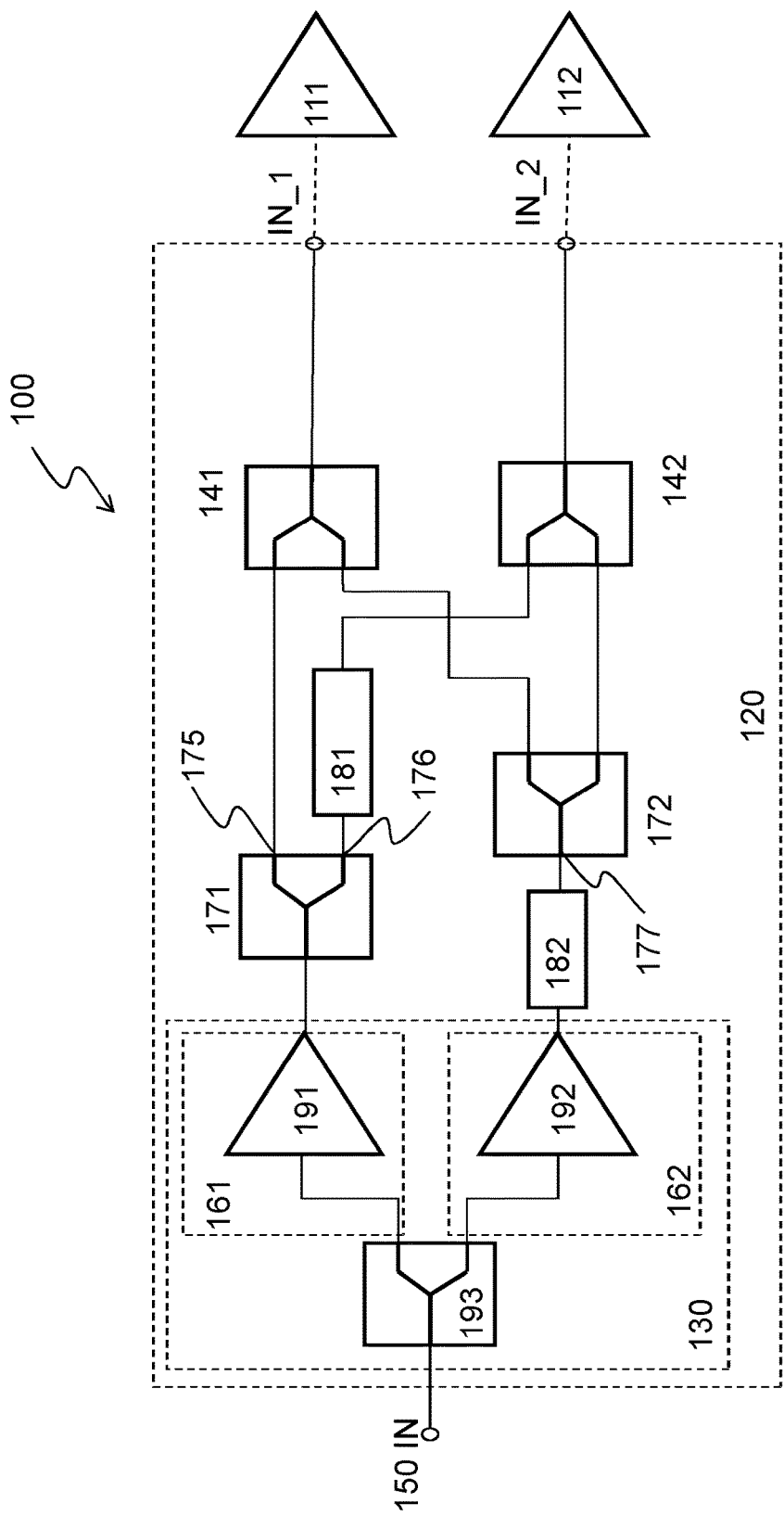
FIG. 4 is a block diagram of the driver circuit according to embodiments herein.

FIG. 4 depicts an exemplifying driver circuit 100 for a composite power amplifier (only shown partially in FIG. 4) according to embodiments herein. The power amplifier is configured to operate a first sub-amplifier 111 and a second sub-amplifier 112 for amplification of an input signal into an output signal. As an example, the power amplifier comprises the first and second sub-amplifiers 111, 112. In this manner, the first and second sub-amplifiers 111, 112 may be operated to amplify the input signal into the output signal.

The first and second sub-amplifiers 111, 112 are connected to an input network 120 for receiving the input signal at an input port 150 of the input network 120. Furthermore, the first and second sub-amplifiers 111, 112 are connected to an output network (not shown) for providing the output signal at an output port (not shown) of the composite power amplifier.

As mentioned, the composite power amplifier is configured to operate the first and second sub-amplifiers 111, 112 in at least one Chireix-mode.

The input network 120 comprises a means 130 configured to provide a first signal derived from the input signal. An amplitude of the first signal is linearly derivable from an amplitude of the input signal over an operational amplitude range of the composite power amplifier. In some examples, the first signal is a copy of the input signal over the entire operational amplitude range. The operational amplitude range of the composite power amplifier may comprise a first amplitude range and a second amplitude range. The first and second amplitude ranges may be non-overlapping and/or different from each other. Moreover, the second amplitude range may subsequent, e.g. in that amplitudes of the second amplitude range are greater than amplitudes of the first amplitude range, to the first amplitude range.

Moreover, the means 130 is configured to provide a second signal derived from the input signal. An average rate of amplitude change of the second signal versus amplitude change of the input signal in the first amplitude range is less than an average rate of amplitude change of the second signal versus amplitude change of the input signal in the second amplitude range. In some examples, an amplitude of the second signal is, in the first amplitude range of the operational amplitude range, below 30% of a maximum amplitude value for amplification of the second signal. It is desired to keep the amplitude of the second signal as small as practically possible. The amplitude of the second signal is linearly derivable from the amplitude of the input signal in the second amplitude range. This means that a slope, i.e. derivative, of the second signal, aka signal response, in the second amplitude range is greater than a slope of the second signal in the first amplitude range.

Referring to FIG. 4, the means 130 may include a first gain unit 191, a second gain unit 192, and a main splitter 193. The first gain unit 191 may be a class A, B or AB amplifier with adjustable gate bias. The second gain unit 192 may be a class C amplifier, whose transition point is adjustable with gate bias. Accordingly, the first gain unit 191 provides the first signal and the second gain unit 192 provides the second signal. The main splitter 193 may be a power splitter, meaning that the input signal may be split into equal part with respect to amplitude or unequal parts with respect to amplitude. The main splitter 193 may even include means for amplification of the input signal.

The second signal may also be generated in many other ways. For example, by means of variable gain amplifiers controlled by respective non-linearly processed peak detector signals.

In this example, the composite power amplifier may include a Chireix-Fagot amplifier of a known type.

Furthermore, the input network 120 comprises a first combiner 141 configured to combine the first signal, at zero degrees phase shift, and the second signal, at 90 degrees phase shift, to obtain a first feeding signal IN_1 to be fed to the first sub-amplifier 111. The first combiner 141 is thus connected to the means 130 in order to be able to provide the first feeding signal IN_1. It shall be understood that the 90 degrees phase shift is approximate, e.g. the phase shift may be in the range of 80 to 100 degrees or other ranges depending on desired performance. It shall also be understood that the zero degrees phase shift is approximate, e.g. the phase shift may be in the range of −10 to 10 degrees or other ranges depending on desired performance.

Additionally, the input network 120 comprises a second combiner 142 configured to combine the first signal, at 180 degrees phase shift, and the second signal, at 90 degrees phase shift, to obtain a second feeding signal IN_2 to be fed to the second sub-amplifier 112. Similarly to the first combiner 141, the second combiner 142 is connected to the means 130 in order to be able to provide the second feeding signal IN_2. Again, it shall be understood that the 90 degrees phase shift is approximate, e.g. the phase shift may be in the range of 80 to 100 degrees or other ranges depending on desired performance. It shall also be understood that the 180 degrees phase shift is approximate, e.g. the phase shift may be in the range of 170 to 190 degrees or other ranges depending on desired performance.

In more detail, the means 130 may comprise a first branch 161 configured to feed the first signal towards the first and second sub-amplifiers 111, 112.

The first branch 161 may be connected to a first splitter 171 having a first output port 175 and a second output port 176. The first output port 175 of the first splitter 171 may be connected to the first combiner 141. The second output port 176 of the first splitter 171 may be connected to a first phase shifting element 181 providing the 180 degrees phase shift of the first signal. The first phase shifting element 181 may be a transmission line of length one half wave length at a center frequency of the composite power amplifier. The center frequency refers to a center of an operational bandwidth, in terms of frequency, of the composite power amplifier.

Moreover, the means 130 may comprise a second branch 162 configured to feed the second signal towards the first and second sub-amplifiers 111, 112. In some examples, the second branch 162 comprises a second phase shifting element 182 providing the 90 degrees phase shift of the second signal. The second phase shifting element may be a transmission line of one quarter wavelength at the center frequency.

The second branch 162 may be connected to a second splitter 172. An input port 177 of the second splitter 172 may be connected to the second phase shifting element 182.

Figure 5A:
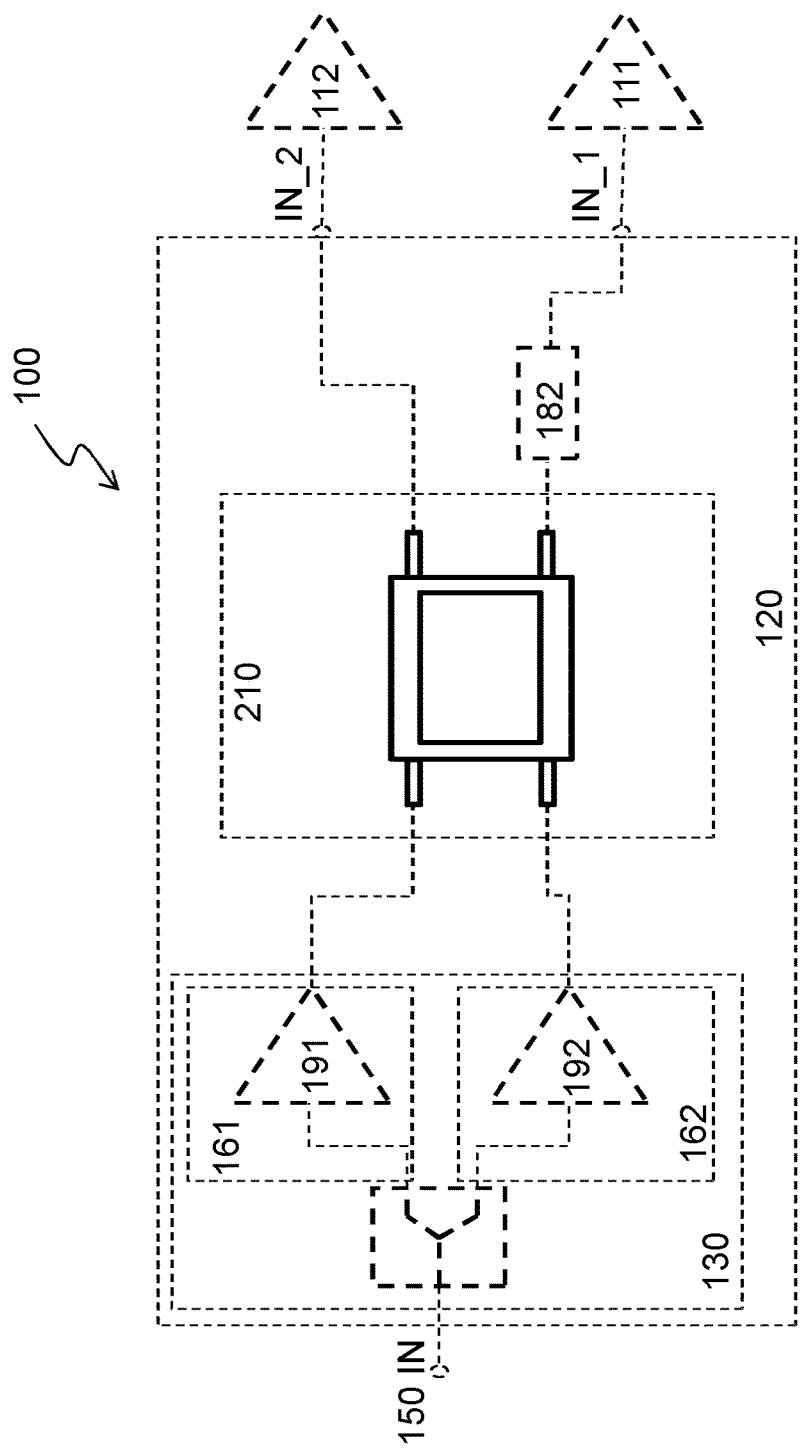
FIG. 5a is another block diagram of the driver circuit according to embodiments herein.

In an alternative embodiment with reference to FIG. 5a, a so called branchline combiner 210 may comprise the first and second combiner 141, 142, the first and second splitter 171, 172. Furthermore, a transmission line length corresponding to the second phase shifting element 182 may be connected to the branchline combiner 210. Expressed somewhat differently, the aforementioned components are replaced by the branchline combiner and the transmission line length. The transmission line length corresponds to the second phase shifting element 182. Thus, the transmission line length provides a 90 degrees phase shift to obtain the first feeding signal. It shall here be noted that, in FIG. 5a, IN_1 and IN_2 are have been swapped. For higher order composite power amplifiers, see below e.g. FIGS. 8, 11 and 14, 180 degrees phase offset needs to be added to a peak branch in order to keep the correct phase relation between the feeding signals. The peak branch is at the feeding signal providing amplification in a higher ranger of amplitudes. See for example IN_3 in FIG. 5a, IN_3 in FIG. 8.

Figure 5B:
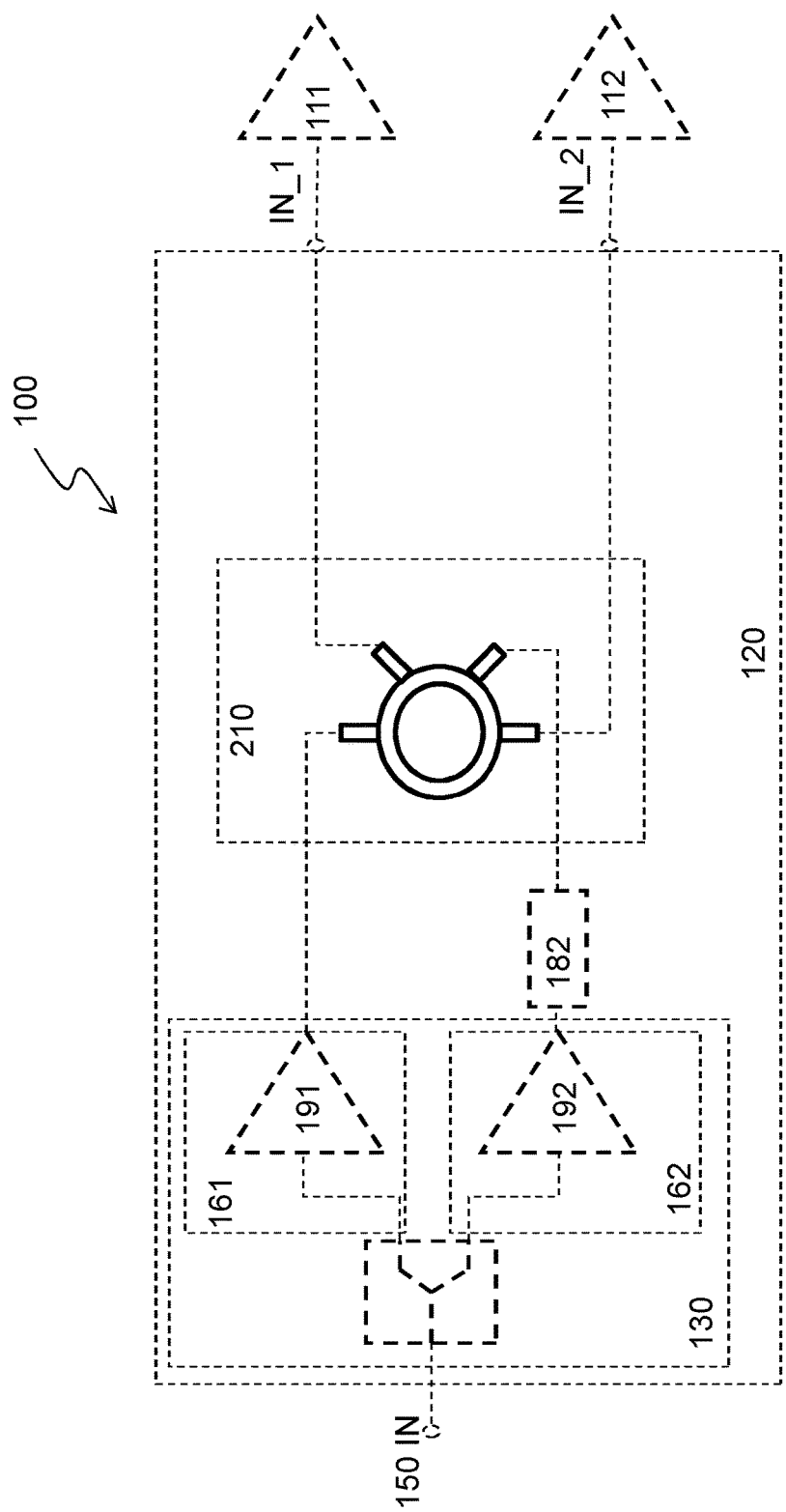
FIG. 5b is a further block diagram of the driver circuit according to embodiments herein.

In a further alternative embodiment with reference to FIG. 5b, a coupler 210 may comprise the first and second combiner 141, 142, the first and second splitter 171, 172. Furthermore, a transmission line length corresponding to the second phase shifting element 182 may be connected to the branchline combiner 210. Expressed somewhat differently, the aforementioned components are replaced by the coupler and the transmission line length. The transmission line length corresponds to the second phase shifting element 182, because the transmission line length applies 270 degrees which is reduced to 180 degrees due to the 90 degrees for all other outputs, i.e. (270-90) degrees=180 degrees as an effective phase shift. The coupler 210 may be a so called rat-race coupler, which is known in the art.

Comparing the rat-race coupler with the branchline combiner, the branchline combiner is smaller, e.g. in terms of footprint on a printed circuit board, than the rat-race coupler. Moreover, with the branchline combiner, there is no need to cross the lines carrying the feeding signals.

Figure 6:
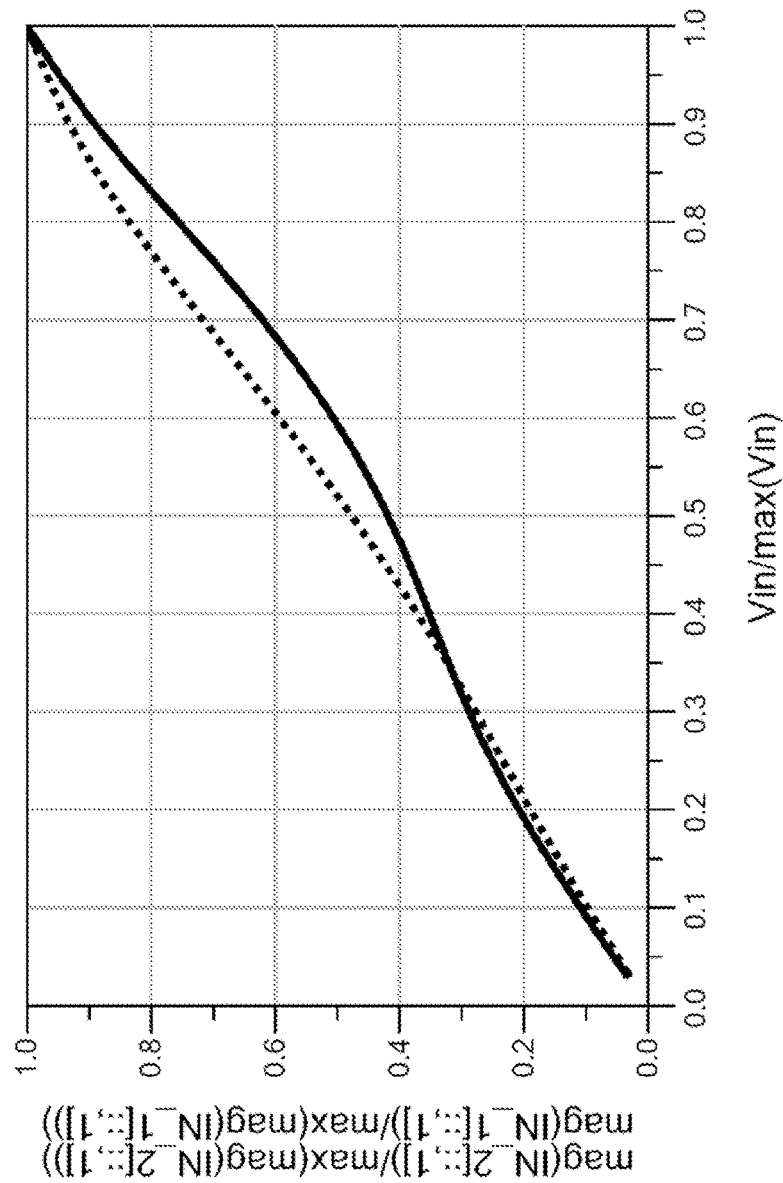
FIG. 6 is a diagram in which amplitude at sub-amplifiers is plotted versus amplitude of the input signal.

FIG. 6 illustrates, in a diagram, normalized amplitudes of the feeding signals IN_1 (solid line), IN_2 (dotted line) for the composite power amplifier partially illustrated in FIG. 4 as a function of normalized input amplitude Vin. Asymmetries in amplitude are caused by imperfections in the driver circuit 100, e.g. mismatch in terms of amplitude-to-amplitude modulation (AM/AM), amplitude-to-phase modulation (AM/PM).

Figure 7:
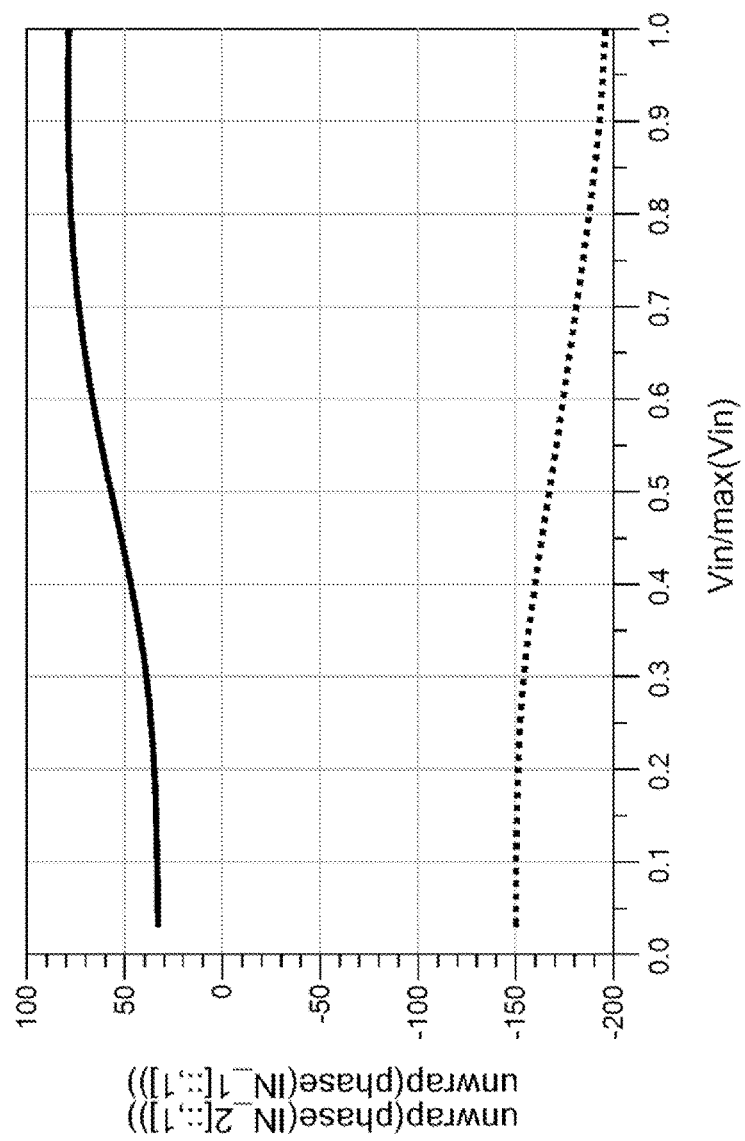
FIG. 7 is a diagram in which phase at sub-amplifiers is plotted versus amplitude of the input signal.

FIG. 7 illustrates, in another diagram, normalized phase of the feeding signals IN_1 (solid line), IN_2 (dotted line) for the composite power amplifier partially illustrated in FIG. 4 as a function of normalized input amplitude Vin. A point at which outphasing starts depends on the implementation of the composite power amplifier. As an example, gate bias point of the second gain unit 192, such as a class C amplifier, set the pint where outphasing starts. It is also possible to start outphasing immediately, e.g. when the first and second gain unti 191, 192 has the same bias.

Figure 8:
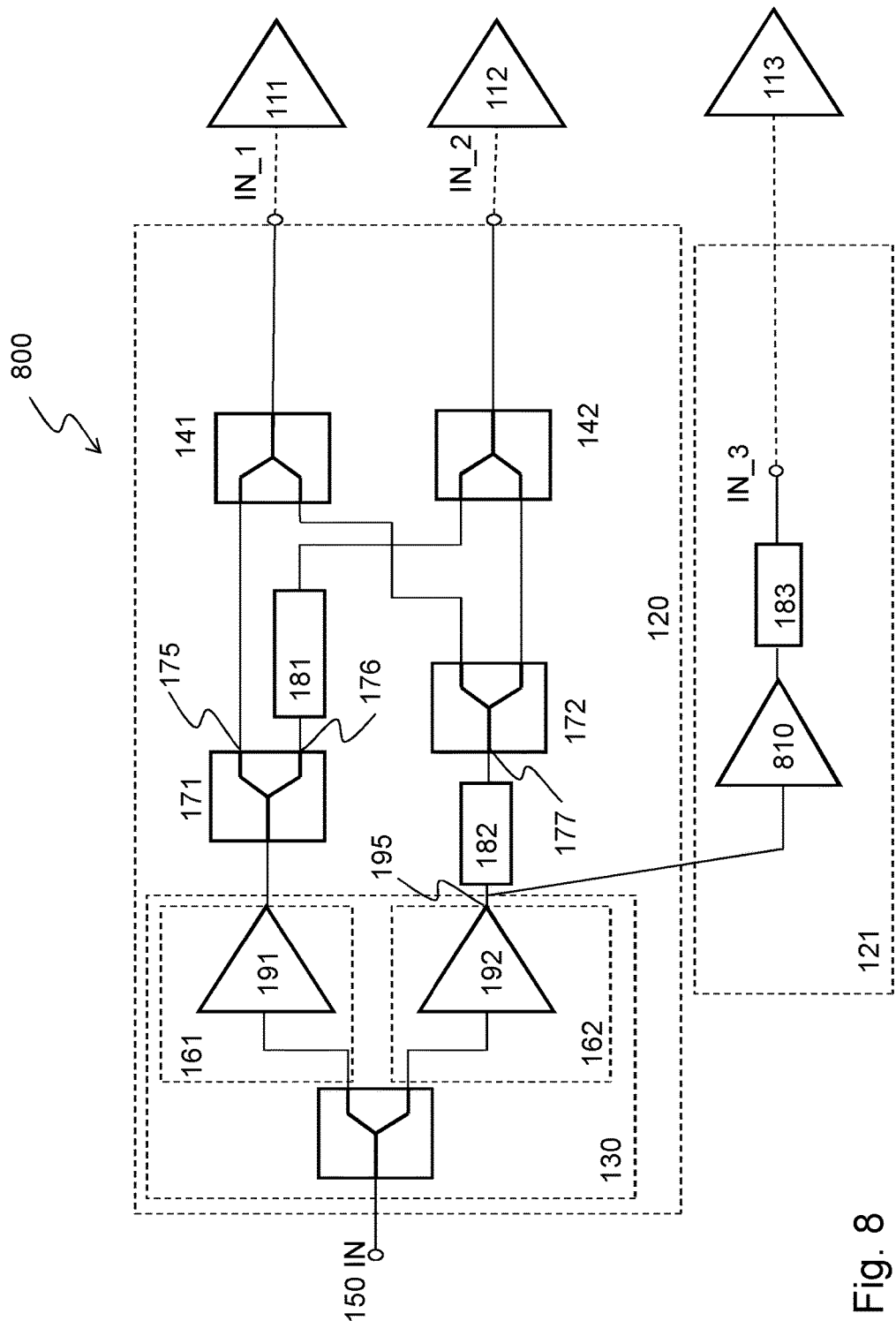
FIG. 8 is a further block diagram of the driver circuit according to embodiments herein.

Now turning to FIG. 8, a further exemplifying composite power amplifier 800 is shown. As mentioned above, the same reference numerals have been used to denote the same features as in the Figures above when applicable.

In this example, the composite power amplifier is further configured to operate a third sub-amplifier 113, connected to a third output port IN_3 of the input network 120. As an example, the composite power amplifier may include the third sub-amplifier 113. It shall be noted that the description of the input network 120 is not provided here in order to avoid undue repetition.

In this example, the input network 120 do, however, also include a further input network 121, which comprises a gain block 810 and a third phase shifting element 183, which may be connected to the third output port IN_3 and the gain block 810. The gain block 810 is connected to an output port 195 of the means, at which output port 195 the second signal is provided. The third phase shifting element 183 may be a further transmission line whose length is adjusted to provide peak amplitudes in a third branch, which includes the further input network 121. This means that also the input network 120 comprises these components. Accordingly, the input network 120 may be configured to provide a third signal, derived from the input signal, to the third sub-amplifier 113.

In this implementation amplitudes of the first and second feeding signals for the first and second sub-amplifiers continue to increase after a second breakpoint with the same slope, in terms on signal response, as after the first break point.

An advantage with the embodiment of FIG. 8 is that a simple and analogue implementation for multi-stage composite power amplifiers, including more than two sub-amplifiers, is provided.

Figure 9:
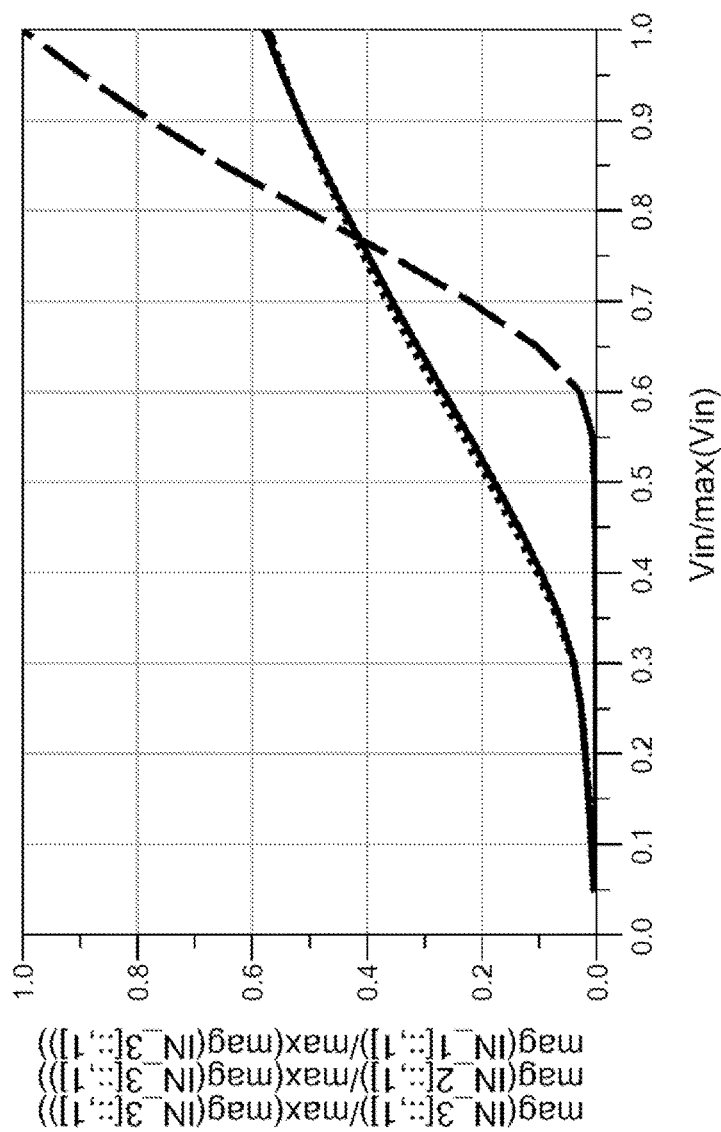
FIG. 9 is a diagram in which amplitude at sub-amplifiers is plotted versus amplitude of the input signal.

FIG. 9 illustrates, in a diagram, normalized amplitudes of the feeding signals IN_1 (solid line), IN_2 (dotted line), IN_3 (dashed line) for the composite power amplifier 800 of FIG. 8 as a function of normalized input amplitude Vin.

Figure 10:
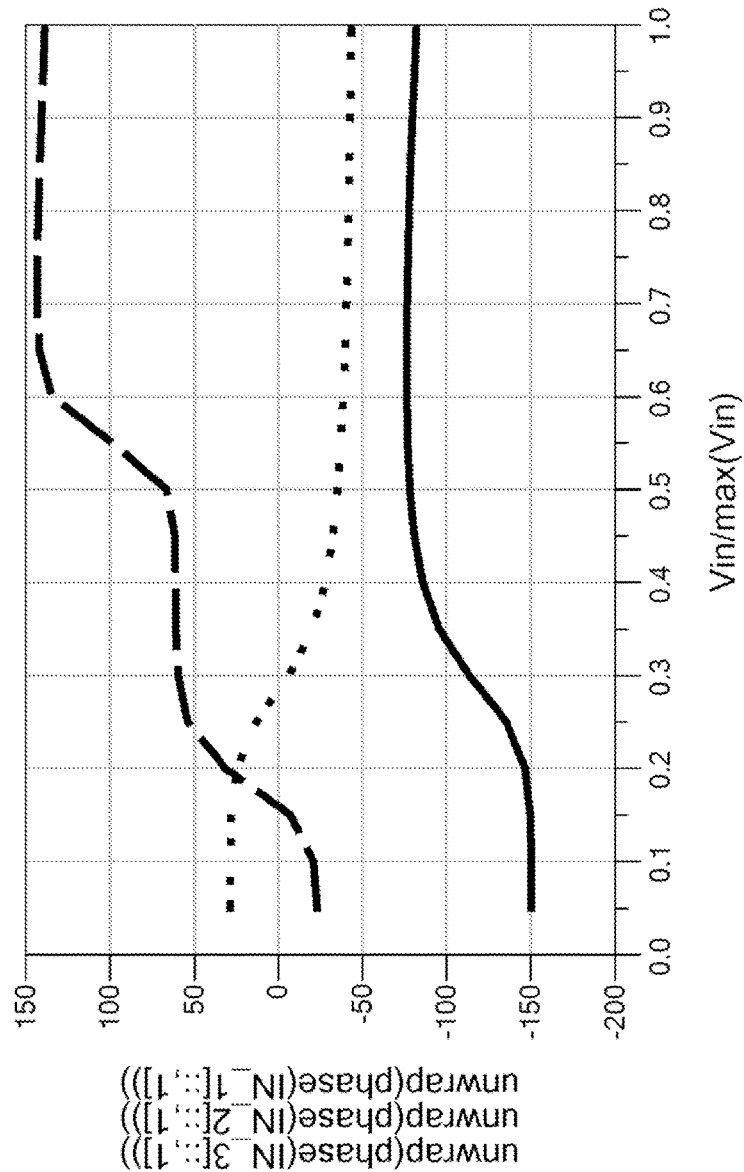
FIG. 10 is a diagram in which phase at sub-amplifiers is plotted versus amplitude of the input signal.

FIG. 10 illustrates, in another diagram, normalized phase of the feeding signals IN_1 (solid line), IN_2 (dotted line), IN_3 (dashed line) for the composite power amplifier 800 of FIG. 8 as a function of normalized input amplitude Vin.

Figure 11:
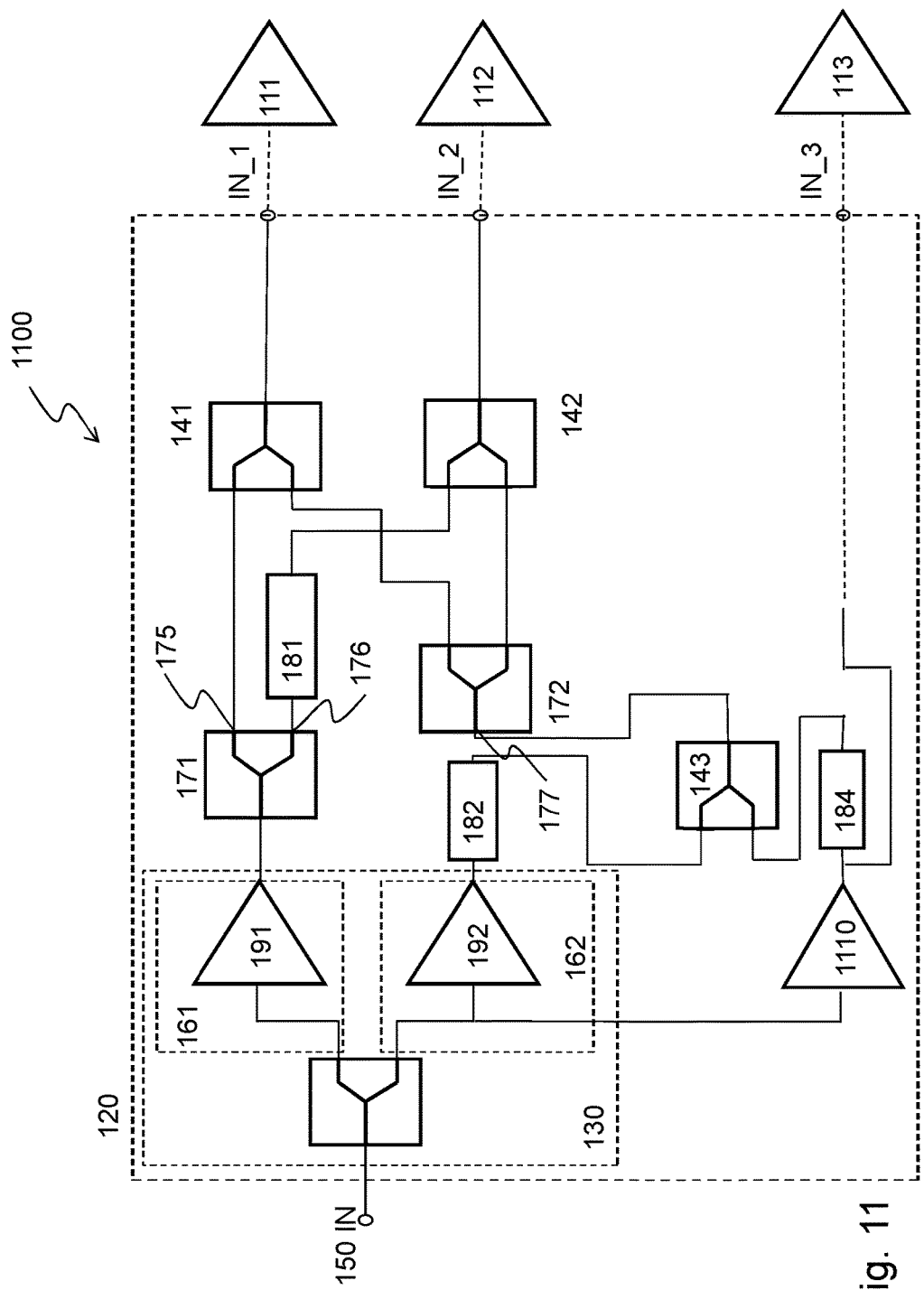
FIG. 11 is a still other block diagram of the driver circuit according to embodiments herein.

FIG. 11 is a further block diagram illustrating another exemplifying three-stage composite power amplifier 1100, such as a Chireix-Doherty amplifier.

The input network 120 may comprise an amplification module 1110 connected to a fourth phase shifting element 184. The fourth phase shifting element 184 may be yet another transmission line of one quarter wavelength at center frequency. The fourth phase shifting element 184 is connected to a third combiner 143, connected to the second phase shifting element 182. The amplification module 810 may further be connected to the third output port IN_3 for feeding a third feeding signal to the third sub-amplifier 113.

In this implementation amplitudes of the first and second feeding signals for the Chireix pair, i.e. the first and second sub-amplifier, increase after second breakpoint but with reduced slope as compared to after the first breakpoint. This means that the second breakpoint is at an amplitude that is lower than an amplitude of the first breakpoint.

Figure 12:
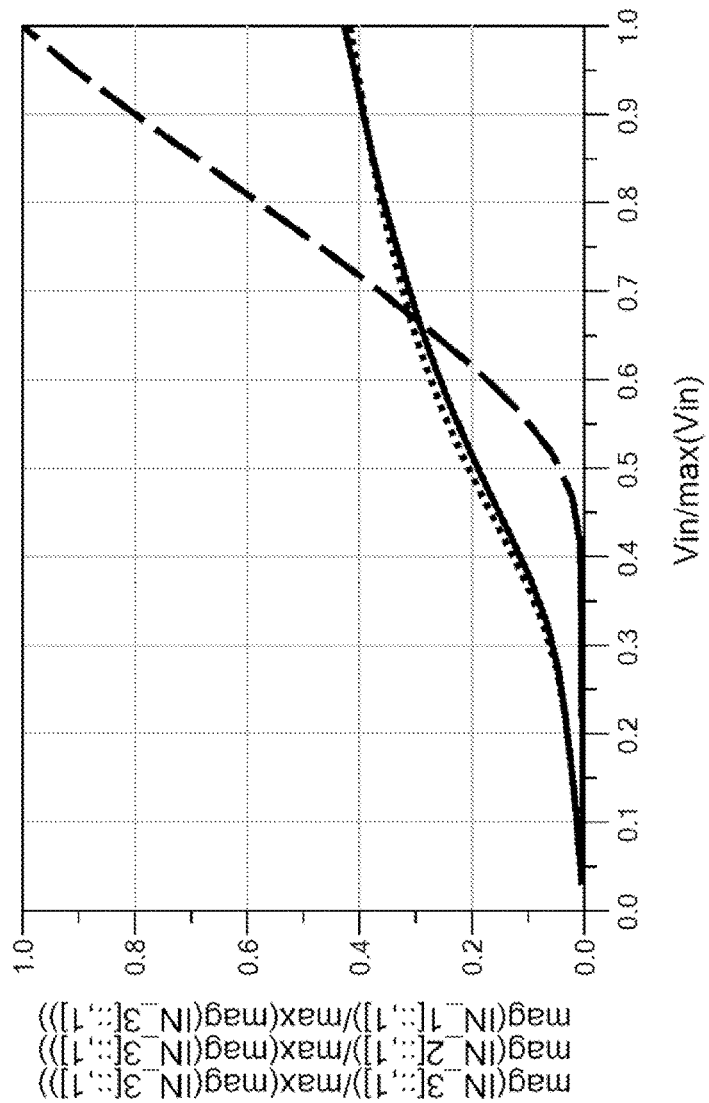
FIG. 12 is a diagram in which amplitude at sub-amplifiers is plotted versus amplitude of the input signal.

FIG. 12 illustrates, in a diagram, normalized amplitudes of the feeding signals IN_1 (solid line), IN_2 (dotted line), IN_3 (dashed line) for the composite power amplifier 1100 of FIG. 11 as a function of normalized input amplitude Vin.

Figure 13:
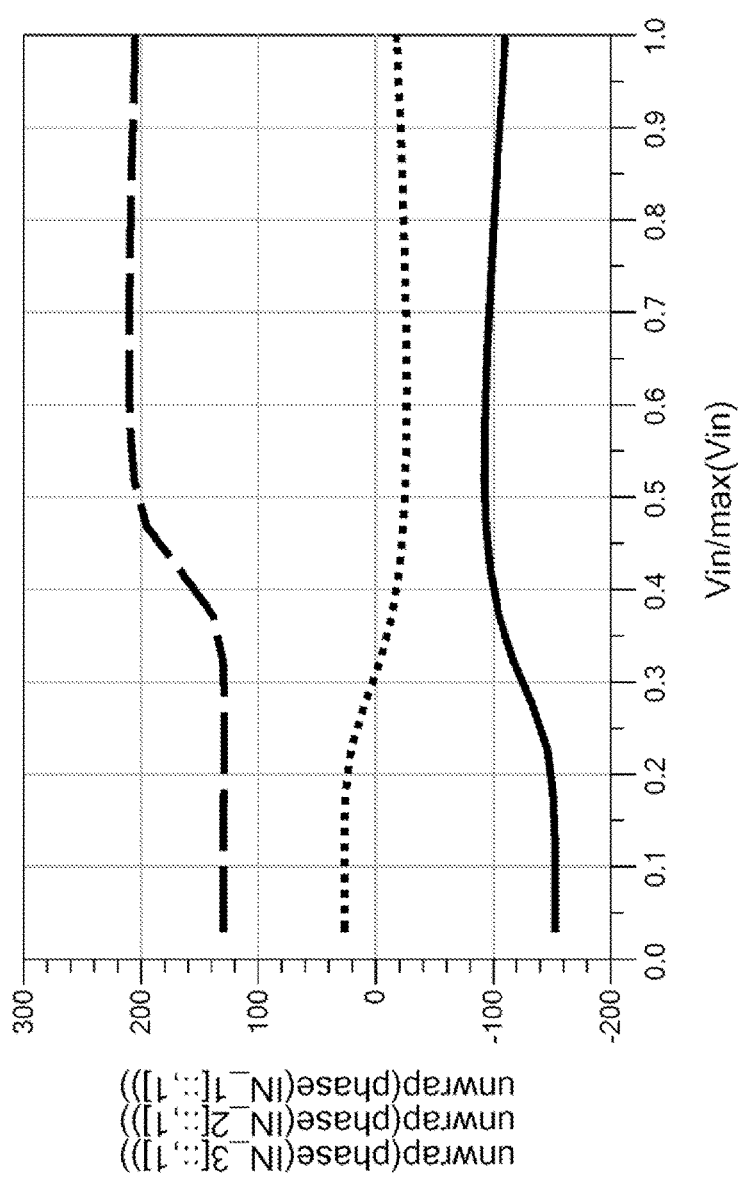
FIG. 13 is a diagram in which phase at sub-amplifiers is plotted versus amplitude of the input signal.

FIG. 13 illustrates, in another diagram, normalized phase of the feeding signals IN_1 (solid line), IN_2 (dotted line), IN_3 (dashed line) for the composite power amplifier 1100 of FIG. 11 as a function of normalized input amplitude Vin.

Figure 14:
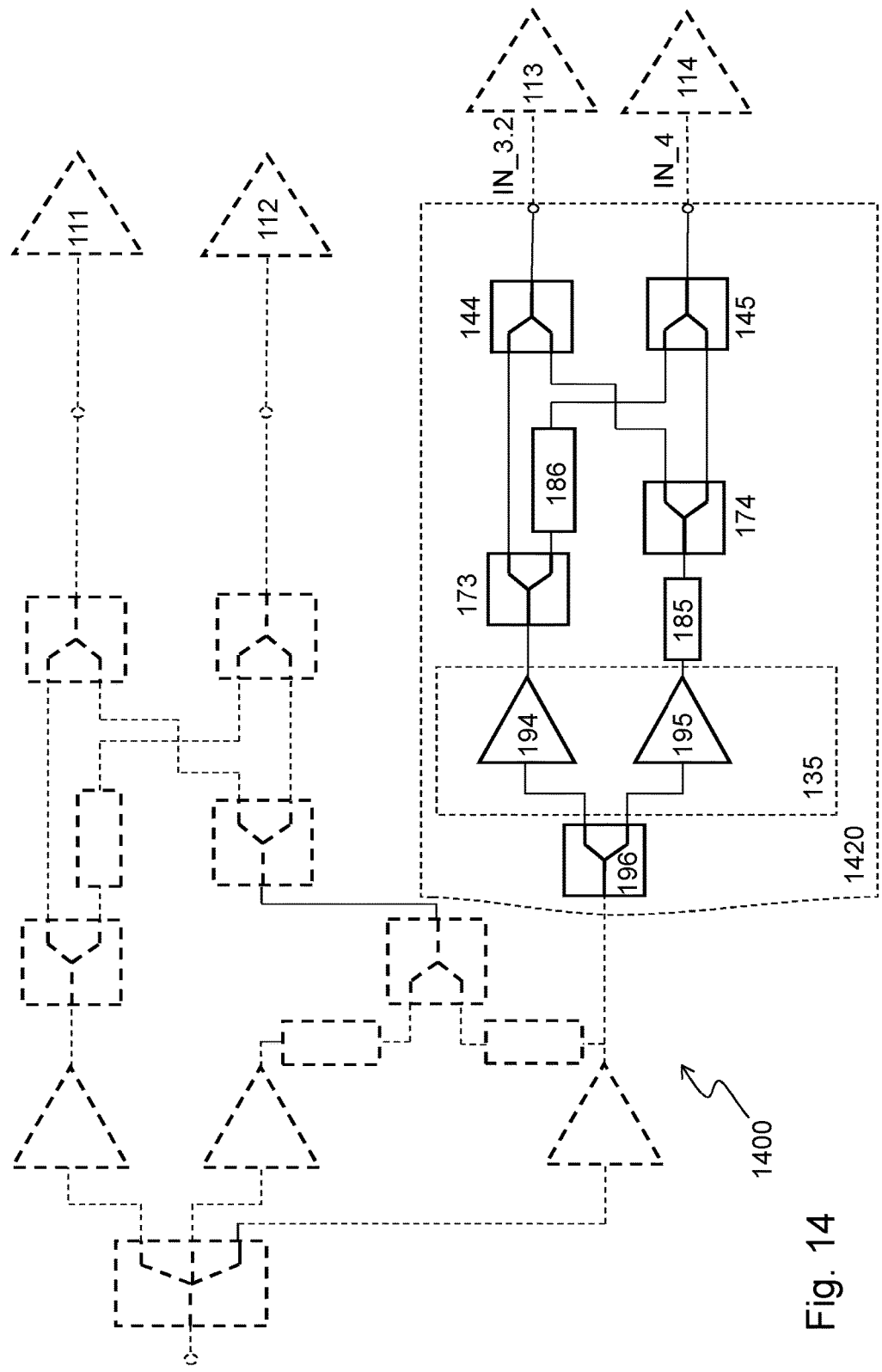
FIG. 14 is yet another block diagram of the driver circuit according to embodiments herein.

A further exemplifying composite power amplifier 1400 is shown in FIG. 14. Again undue repetition is avoided by merely describing the additions in the example in view of the embodiment of FIG. 11.

The third output port may be connected to a sub-input network 1420 for connection to a Chireix-Chireix pair in the form of the third-sub amplifier 113 and a fourth sub-amplifier 114.

The sub-input network 1420 resembles, e.g. has the same of similar characteristics in terms of signal response, the input network 120 of the embodiments above. Accordingly, the sub-input network 121 may comprise a further means 135 configured to provide a fourth signal derived from the third feeding signal, wherein an amplitude of the fourth signal is linearly derivable from an amplitude of the third feeding signal over an operational amplitude range of the Chireix-Chireix pair.

Moreover, the further means 135 is configured to provide a fifth signal derived from the third feeding signal, wherein an average rate of amplitude change of the fifth signal versus amplitude change of the third feeding signal in a first amplitude range of an operational amplitude range of the Chireix-Chireix pair is greater than an average rate of amplitude change of the fifth signal versus amplitude change of the third feeding signal in a second amplitude range of the operational amplitude range of the Chireix-Chireix pair. The further means 135 is similar to the means 130.

Referring to FIG. 14, the further means 135 may include a further first gain unit 194, a further second gain unit 195, and a further main splitter 196. The further first gain unit 194 may be a class A, B or AB amplifier with adjustable gate bias. The further second gain unit 195 may be a class C amplifier, whose transition point is adjustable with gate bias. Accordingly, the further first gain unit 194 provides the fourth signal and the further second gain unit 195 provides the fifth signal. The further main splitter 196 may be a power splitter, meaning that the third feeding signal may be split into equal part with respect to amplitude or unequal parts with respect to amplitude. The further main splitter 196 may even include means for amplification of the third feeding signal.

The sub-input network 1420 may further comprise a fourth combiner 144 configured to combine the fourth signal, at zero degrees phase shift, and the fifth signal, at 90 degrees phase shift, to obtain a first ChireixChireix feeding signal to be fed to the third sub-amplifier 113.

Furthermore, the sub-input network 1420 may further comprise a fifth combiner 145 configured to combine the fourth signal, at 180 degrees phase shift, and the fifth signal, at 90 degrees phase shift, to obtain a second Chireix-Chireix feeding signal to be fed to the fourth sub-amplifier 114, at an output port IN_4 of the input network 120. This means that the input network 120 further comprises the sub-input network 1420.

Figure 15:
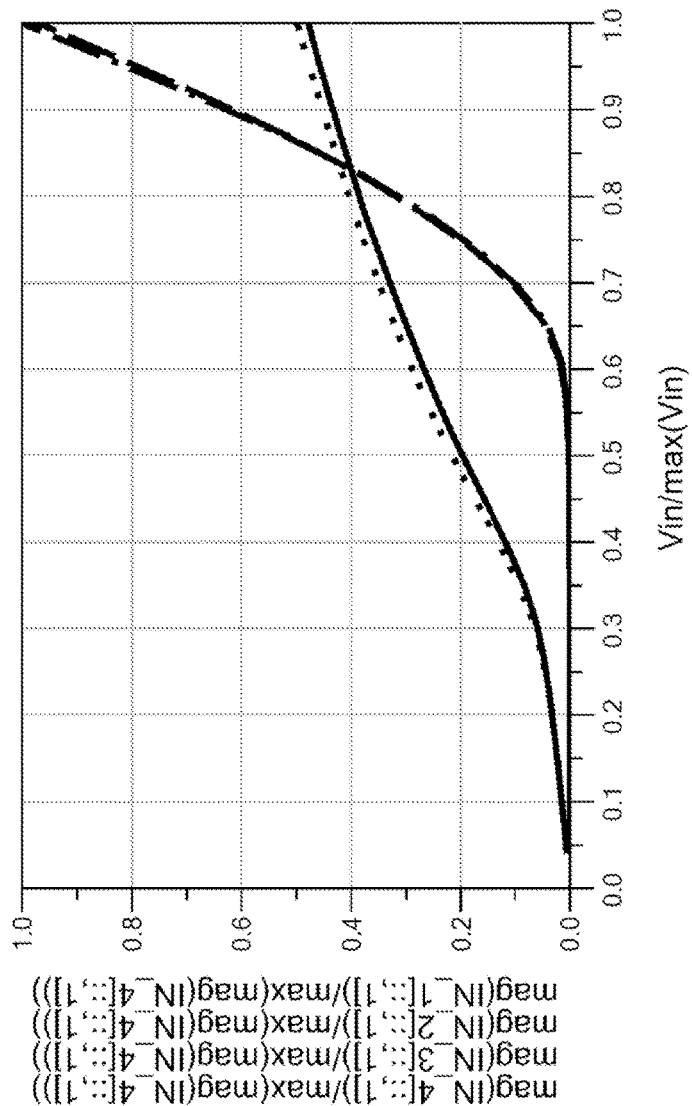
FIG. 15 is a diagram in which amplitude at sub-amplifiers is plotted versus amplitude of the input signal.

FIG. 15 illustrates, in a diagram, normalized amplitudes of the feeding signals IN_1 (solid line), IN_2 (dotted line), IN_3 (dashed line) for the composite power amplifier 1400 of FIG. 14 as a function of normalized input amplitude Vin.

Figure 16:
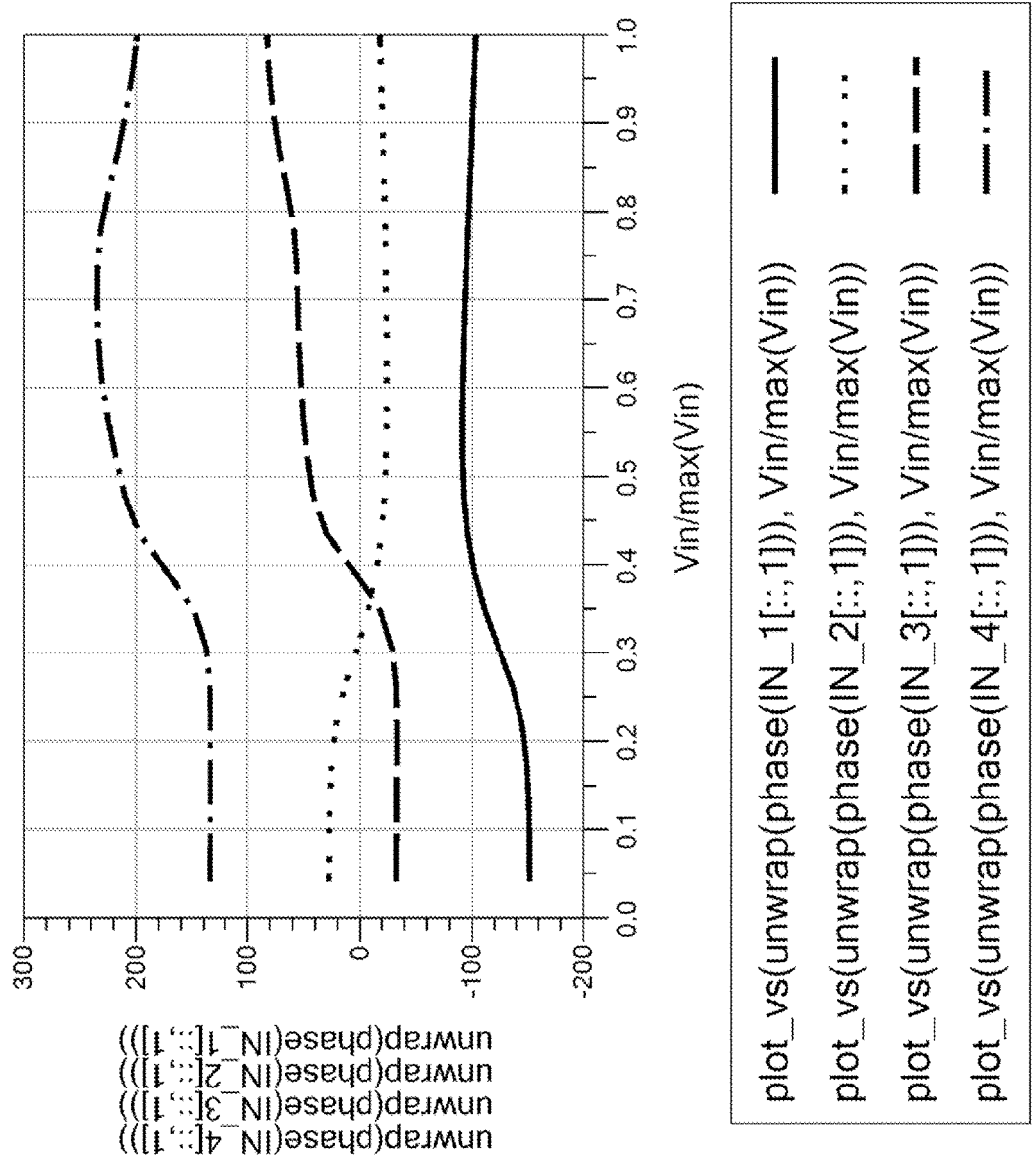
FIG. 16 is a diagram in which phase at sub-amplifiers is plotted versus amplitude of the input signal.

FIG. 16 illustrates, in another diagram, normalized phase of the feeding signals IN_1 (solid line), IN_2 (dotted line), IN_3 (dashed line) for the composite power amplifier 1400 of FIG. 14 as a function of normalized input amplitude Vin.

In conclusion, high efficiency multistage power amplifiers, e.g. Chireix-Fagot, Chireix-Doherty, Chireix-Chireix as illustrated in the Figures above) may require complicated drive schemes. With the embodiments herein, the complicated drive schemes, i.e. the provision of feeding signals, is realized in a simple and effective manner by deriving the feeding signals from the input signal, being a RF modulated signal source. The embodiments implement the complicated driving scheme by providing a specially designed input network, which has been described above.

According to the embodiments, the input network is designed by use of a limited number of added components.

In effect, the embodiments herein provide a way of splitting an RF modulated input signal into a linear path and "class C"- path, et the first and second signals above. By combining the first and second signals in an additive or subtractive manner, the feeding signals are provided. The feeding signals are linear with constant phase for amplitudes below breakpoint and outphased from the breakpoint and up. The second signal may, after some amplification, be used for driving the peak amplifier of the Chireix-Doherty, such as in FIGS. 8 and 11.

Figure 17:
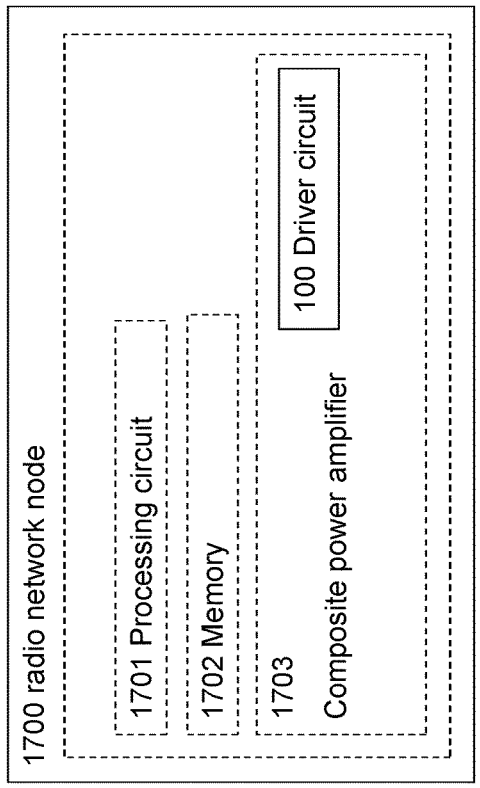
FIG. 17 illustrates an exemplifying radio network node according to embodiments herein.

FIG. 17 shows an exemplifying radio network node 1700.

As used herein, the term "radio network node" may refer to is a piece of equipment that facilitates wireless communication between user equipment (UE) and a network. Accordingly, the term "radio network node" may refer to a Base Station (BS), a Base Transceiver Station (BTS), a Radio Base Station (RBS), a NodeB in so called Third Generation (3G) networks, evolved Node B, eNodeB or eNB in Long Term Evolution (LTE) networks, or the like. In UMTS Terrestrial Radio Access Network (UTRAN) networks, where UTMS is short for Universal Mobile Telecommunications System, the term "radio network node" may also refer to a Radio Network Controller. Furthermore, in Global System for Mobile Communications (GSM) EDGE Radio Access Network (GERAN), where EDGE is short for Enhanced Data rates for GSM Evolution, the term "radio network node" may also refer to a Base Station Controller (BSC).

The radio network node 1700 may comprise a processing circuit 1701 and/or a memory 1702.

Furthermore, the radio network node 1700 comprises the driver circuit 100 according to the embodiments described above. Expressed differently, the radio network node 1700 may comprise a composite power amplifier 1803, which comprises the driver circuit 100 as disclosed herein.

The radio network node 1700 may further comprise additional transceiver circuitry (not shown) for facilitating transmission and reception of data, e.g. in the form of radio signals.

Figure 18:
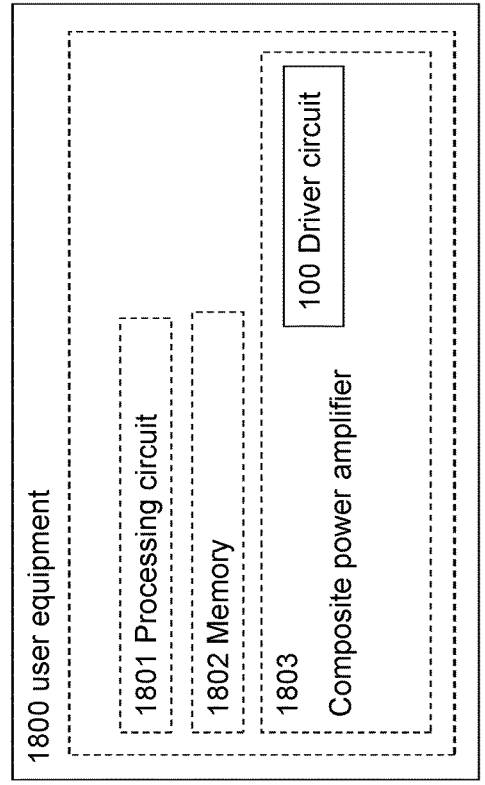
FIG. 18 illustrates an exemplifying user equipment according to embodiments herein.

FIG. 18 shows an exemplifying user equipment 1800.

As used herein, the term "user equipment" may refer to a mobile phone, a cellular phone, a Personal Digital Assistant (PDA) equipped with radio communication capabilities, a smartphone, a laptop or personal computer (PC) equipped with an internal or external mobile broadband modem, a tablet PC with radio communication capabilities, a portable electronic radio communication device, a sensor device equipped with radio communication capabilities or the like. The sensor may be any kind of weather sensor, such as wind, temperature, air pressure, humidity etc. As further examples, the sensor may be a light sensor, an electronic switch, a microphone, a loudspeaker, a camera sensor etc.

The user equipment 1800 may comprise a processing circuit 1801 and/or a memory 1802.

Furthermore, the user equipment 1800 comprises the driver circuit 100 according to the embodiments described above. Expressed differently, the user equipment 1800 may comprise a composite power amplifier 1803, which comprises the driver circuit 100 as disclosed herein.

The user equipment 1800 may further comprise additional transceiver circuitry (not shown) for facilitating transmission and reception of data, e.g. in the form of radio signals.

As used herein, the term "processing circuit" may be a processing unit, a processor, an application specific integrated circuit (ASIC), a field-programmable gate array (FPGA) or the like. As an example, a processor, an ASIC, an FPGA or the like may comprise one or more processor kernels. In some examples, the processing circuit may be embodied by a software or hardware module. Any such module may be a determining means, estimating means, capturing means, associating means, comparing means, identification means, selecting means, receiving means, transmitting means or the like as disclosed herein. As an example, the expression "means" may be a unit, such as a determining unit, selecting unit, etc.

As used herein, the term "memory" may refer to a hard disk, a magnetic storage medium, a portable computer diskette or disc, flash memory, random access memory (RAM) or the like. Furthermore, the term "memory" may refer to an internal register memory of a processor or the like.

As used herein, the terms "number", "value" may be any kind of digit, such as binary, real, imaginary or rational number or the like. Moreover, "number", "value" may be one or more characters, such as a letter or a string of letters. "number", "value" may also be represented by a bit string.

As used herein, the expression "in some embodiments" has been used to indicate that the features of the embodiment described may be combined with any other embodiment disclosed herein.

Even though embodiments of the various aspects have been described, many different alterations, modifications and the like thereof will become apparent for those skilled in the art. The described embodiments are therefore not intended to limit the scope of the present disclosure.

The invention claimed is:

1. A driver circuit for a composite power amplifier comprising a first and a second sub-amplifier for amplification of an input signal into an output signal, wherein the first and second sub-amplifiers are connected to an input network for receiving the input signal at an input port of the input network, wherein the composite power amplifier is configured to operate the first and second sub-amplifiers in at least one Chireix-mode, wherein the driver circuit for the composite power amplifier is characterized in that the input network comprises:
   a means configured to provide:
   a first signal derived from the input signal, wherein an amplitude of the first signal is linearly derivable from an amplitude of the input signal over an operational amplitude range of the composite power amplifier, and
   a second signal derived from the input signal, wherein an average rate of amplitude change of the second signal versus amplitude change of the input signal in a first amplitude range is less than an average rate of amplitude change of the second signal versus amplitude change of the input signal in a second amplitude range,
   a first combiner configured to combine the first signal, at zero degrees phase shift, and the second signal, at 90 degrees phase shift, to obtain a first feeding signal to be fed to the first sub-amplifier, and
   a second combiner configured to combine the first signal, at 180 degrees phase shift, and the second signal, at 90 degrees phase shift, to obtain a second feeding signal to be fed to the second sub-amplifier,
   wherein the means comprises a first branch configured to feed the first signal towards the first and second sub-amplifiers, further wherein the first branch is connected to a first splitter having a first output port and a second output port, wherein the first output port of the first splitter is connected to the first combiner, and wherein the second output port of the first splitter is connected to a first phase shifting element providing the 180 degrees phase shift of the first signal.

2. The driver circuit according to claim 1, wherein the means comprises a second branch configured to feed the second signal towards the first and second sub-amplifiers.

3. The driver circuit according to claim 2, wherein the second branch comprises a second phase shifting element providing the 90 degrees phase shift of the second signal.

4. The driver circuit according to claim 2, wherein the second branch is connected to a second splitter, wherein an input port of the second splitter is connected to a second phase shifting element.

5. The driver circuit according to claim 2, wherein a coupler comprises the first and second combiner, the first and second splitter and a transmission line length corresponding to a second phase shifting element.

6. The driver circuit according to claim 3, wherein the composite power amplifier further is configured to operate a third sub-amplifier.

7. The driver circuit according to claim 6, wherein the input network is configured to provide a third signal, derived from the input signal, to the third sub-amplifier.

8. The driver circuit according to claim 7, wherein the input network comprises a gain block and a third phase shifting element.

9. The driver circuit according to claim 8, wherein the input network comprises an amplification module connected to a fourth phase shifting element, wherein the fourth phase shifting element is connected to a third combiner, connected to the second phase shifting element, wherein the amplification module further is connected to a third output port for feeding a third feeding signal to the third sub-amplifier.

10. The driver circuit according to claim 9, wherein the third output port is connected to a sub-input network for connection to a Chireix-Chireix pair in the form of the third-sub amplifier and a fourth sub-amplifier, wherein the sub-input network comprises:
   a further means configured to provide:
   a fourth signal derived from the third feeding signal, wherein an amplitude of the fourth signal is linearly derivable from an amplitude of the third feeding signal over an operational amplitude range of the Chireix-Chireix pair, and
   a fifth signal derived from the third feeding signal, wherein an average rate of amplitude change of the fifth signal versus amplitude change of the third feeding signal in a first amplitude range of an operational amplitude range of the Chireix-Chireix pair is greater than an average rate of amplitude change of the fifth signal versus amplitude change of the third feeding signal in a second amplitude range of the operational amplitude range of the Chireix-Chireix pair,
   a fourth combiner configured to combine the fourth signal, at zero degrees phase shift, and the fifth signal, at 90 degrees phase shift, to obtain a first Chireix-Chireix feeding signal to be fed to the third sub-amplifier,
   a fifth combiner configured to combine the fourth signal, at 180 degrees phase shift, and the fifth signal, at 90 degrees phase shift, to obtain a second Chireix-Chireix feeding signal to be fed to the fourth sub-amplifier.

11. A composite power amplifier comprising the driver circuit according to claim 1.

12. A radio network node comprising the driver circuit according to claim 1.

13. A user equipment comprising the driver circuit according claim 1.

* * * * *